United States Patent
Takasu

(10) Patent No.: US 8,207,581 B2
(45) Date of Patent: Jun. 26, 2012

(54) SEMICONDUCTOR DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 84 days.

(21) Appl. No.: 12/924,262

(22) Filed: Sep. 23, 2010

(65) Prior Publication Data

US 2011/0073947 A1   Mar. 31, 2011

(30) Foreign Application Priority Data

Sep. 25, 2009 (JP) .................................. 2009-221241

(51) Int. Cl.
*H01L 21/00* (2006.01)
(52) U.S. Cl. ...................... 257/355; 257/349; 257/378
(58) Field of Classification Search .................. 257/355, 257/349, 378
See application file for complete search history.

(56) References Cited

U.S. PATENT DOCUMENTS

| | | | | |
|---|---|---|---|---|
| 6,100,127 A * | 8/2000 | Wu | .................. | 438/238 |
| 6,310,380 B1 * | 10/2001 | Cai et al. | .................. | 257/355 |
| 6,399,990 B1 * | 6/2002 | Brennan et al. | .................. | 257/355 |
| 6,476,445 B1 * | 11/2002 | Brown et al. | .................. | 257/347 |
| 6,482,747 B1 * | 11/2002 | Takahashi et al. | .................. | 438/715 |
| 6,600,198 B2 * | 7/2003 | Ohnakado et al. | .................. | 257/357 |
| 6,670,678 B2 * | 12/2003 | Kojima | .................. | 257/355 |
| 6,774,017 B2 * | 8/2004 | Brown et al. | .................. | 438/480 |
| 6,876,055 B2 * | 4/2005 | Iwata et al. | .................. | 257/510 |
| 6,909,149 B2 * | 6/2005 | Russ et al. | .................. | 257/355 |
| 7,071,515 B2 * | 7/2006 | Sheu et al. | .................. | 257/374 |
| 7,098,130 B1 * | 8/2006 | Kim et al. | .................. | 438/638 |
| 7,256,463 B2 * | 8/2007 | Matsumoto et al. | .................. | 257/392 |
| 7,276,768 B2 * | 10/2007 | Furukawa et al. | .................. | 257/374 |
| 7,285,458 B2 * | 10/2007 | Manna et al. | .................. | 438/237 |
| 7,304,354 B2 * | 12/2007 | Morris | .................. | 257/372 |
| 7,384,854 B2 * | 6/2008 | Voldman | .................. | 438/380 |
| 7,399,679 B2 * | 7/2008 | Sheu et al. | .................. | 438/433 |
| 7,420,250 B2 * | 9/2008 | Lee et al. | .................. | 257/355 |
| 7,521,771 B2 * | 4/2009 | Choi | .................. | 257/501 |
| 7,586,158 B2 * | 9/2009 | Hierlemann et al. | .................. | 257/369 |
| 7,615,417 B2 * | 11/2009 | Manna et al. | .................. | 438/133 |
| 7,645,676 B2 * | 1/2010 | Furukawa et al. | .................. | 438/407 |
| 7,667,280 B2 * | 2/2010 | Takasu et al. | .................. | 257/409 |
| 7,737,526 B2 * | 6/2010 | Williams et al. | .................. | 257/506 |
| 7,750,409 B2 * | 7/2010 | Takasu et al. | .................. | 257/355 |

(Continued)

FOREIGN PATENT DOCUMENTS

JP    2009147001 A  *  7/2009

(Continued)

OTHER PUBLICATIONS

Patent Abstracts of Japan, publication No. 07-045829, publication date Feb. 14, 1995.

*Primary Examiner* — Laura Menz
(74) *Attorney, Agent, or Firm* — Adams & Wilks

(57) ABSTRACT

Provided is a semiconductor device in which the first trench isolation regions is placed between a substrate potential-fixing P-type diffusion region of an ESD protection NMOS transistor and source and drain regions of the ESD protection NMOS transistor, and has a depth greater than a depth of the second trench isolation region that is placed between a substrate potential-fixing P-type diffusion region of an NMOS transistor for internal circuit and source and drain regions of the NMOS transistor for internal circuit.

3 Claims, 1 Drawing Sheet

U.S. PATENT DOCUMENTS

| | | | | |
|---|---|---|---|---|
| 7,791,145 B2* | 9/2010 | Furukawa et al. | 257/374 |
| 7,795,681 B2* | 9/2010 | Williams et al. | 257/349 |
| 7,804,138 B2* | 9/2010 | Morris | 257/372 |
| 7,821,099 B2* | 10/2010 | Voldman | 257/516 |
| 7,838,940 B2* | 11/2010 | Schneider et al. | 257/355 |
| 7,868,414 B2* | 1/2011 | Williams et al. | 257/513 |
| 7,880,240 B2* | 2/2011 | Takasu | 257/409 |
| 7,893,497 B2* | 2/2011 | Takasu | 257/355 |
| 7,898,035 B2* | 3/2011 | Takasu et al. | 257/355 |
| 8,035,190 B2* | 10/2011 | Liu et al. | 257/510 |
| 8,093,145 B2* | 1/2012 | Morris | 438/527 |
| 8,097,930 B2* | 1/2012 | Shrivastava et al. | 257/506 |
| 2002/0145176 A1* | 10/2002 | Takasu et al. | 257/529 |
| 2002/0145177 A1* | 10/2002 | Takasu et al. | 257/529 |
| 2002/0167050 A1* | 11/2002 | Brown et al. | 257/347 |
| 2003/0168701 A1* | 9/2003 | Voldman | 257/355 |
| 2004/0012068 A1* | 1/2004 | Iwata et al. | 257/506 |
| 2005/0012173 A1* | 1/2005 | Sheu et al. | 257/519 |
| 2005/0139865 A1* | 6/2005 | Choi | 257/204 |
| 2005/0173727 A1* | 8/2005 | Manna et al. | 257/173 |
| 2006/0079068 A1* | 4/2006 | Sheu et al. | 438/433 |
| 2006/0099745 A1* | 5/2006 | Hsu et al. | 438/149 |
| 2007/0018328 A1* | 1/2007 | Hierlemann et al. | 257/762 |
| 2007/0040222 A1* | 2/2007 | Van Camp et al. | 257/357 |
| 2007/0045751 A1* | 3/2007 | Van Camp et al. | 257/378 |
| 2007/0170518 A1* | 7/2007 | Furukawa et al. | 257/374 |
| 2007/0241409 A1* | 10/2007 | Furukawa et al. | 257/372 |
| 2008/0001168 A1* | 1/2008 | Manna et al. | 257/173 |
| 2008/0057671 A1* | 3/2008 | Furukawa et al. | 438/426 |
| 2008/0191308 A1* | 8/2008 | Takasu et al. | 257/501 |
| 2008/0197425 A1* | 8/2008 | Takasu | 257/409 |
| 2008/0237656 A1* | 10/2008 | Williams et al. | 257/262 |
| 2008/0237704 A1* | 10/2008 | Williams et al. | 257/338 |
| 2008/0237706 A1* | 10/2008 | Williams et al. | 257/343 |
| 2008/0237782 A1* | 10/2008 | Williams et al. | 257/513 |
| 2008/0237783 A1* | 10/2008 | Williams et al. | 257/513 |
| 2008/0251846 A1* | 10/2008 | Voldman | 257/355 |
| 2009/0039431 A1* | 2/2009 | Takasu | 257/360 |
| 2009/0050966 A1* | 2/2009 | Takasu | 257/355 |
| 2009/0050967 A1* | 2/2009 | Takasu | 257/355 |
| 2009/0050968 A1* | 2/2009 | Takasu et al. | 257/355 |
| 2009/0050969 A1* | 2/2009 | Takasu | 257/360 |
| 2009/0152633 A1* | 6/2009 | Takasu et al. | 257/360 |
| 2009/0174004 A1* | 7/2009 | Choi | 257/369 |
| 2010/0013515 A1* | 1/2010 | Jung | 324/765 |
| 2011/0012196 A1* | 1/2011 | Williams et al. | 257/343 |
| 2011/0073947 A1* | 3/2011 | Takasu | 257/355 |
| 2011/0073948 A1* | 3/2011 | Takasu | 257/355 |
| 2011/0127615 A1* | 6/2011 | Tanaka | 257/378 |
| 2011/0163384 A1* | 7/2011 | Takasu | 257/355 |
| 2011/0303982 A1* | 12/2011 | Chung et al. | 257/363 |

FOREIGN PATENT DOCUMENTS

| | | | |
|---|---|---|---|
| JP | 2011071327 A | * | 4/2011 |
| JP | 2011210896 A | * | 10/2011 |

* cited by examiner

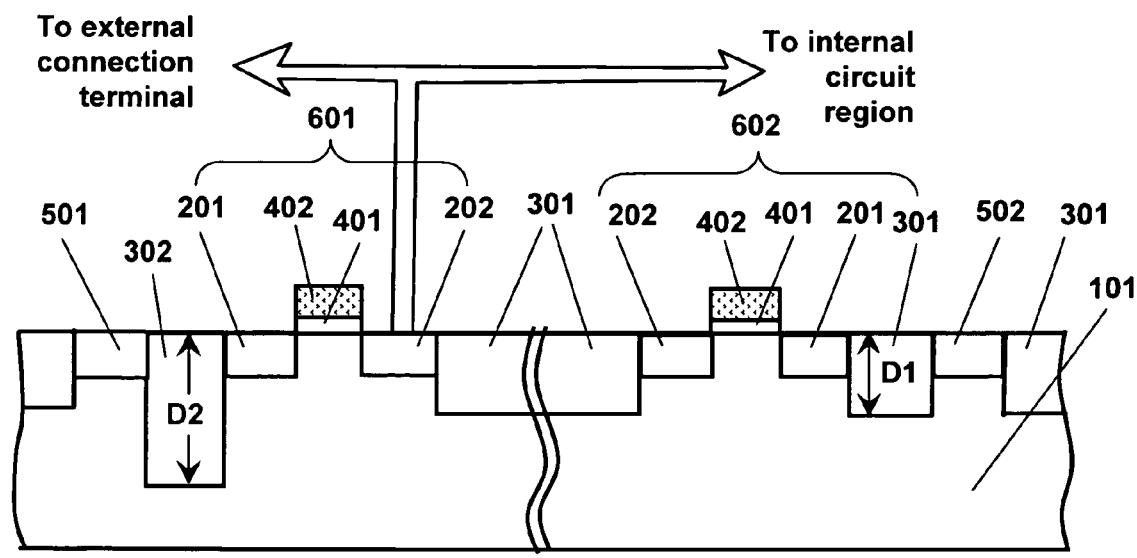

SEMICONDUCTOR DEVICE

BACKGROUND OF THE INVENTION

1. Field of the Invention

The present invention relates to a semiconductor device which includes, between an external connection terminal and an internal circuit region, an ESD protection element for protecting an internal element formed in the internal circuit region against breakdown from ESD.

2. Description of the Related Art

In semiconductor devices that include MOS transistors, it is a known practice to install an "off" transistor as an ESD protection element for preventing the breakdown of an internal circuit due to static electricity from an external connection PAD. The "off" transistor is an NMOS transistor that is kept in an off state by fixing its gate electric potential to a ground voltage (Vss).

To prevent the ESD breakdown of an internal circuit element, it is important to draw as large a ratio of ESD pulses as possible into the off transistor while inhibiting ESD pulses from propagating to the internal circuit element, or to convert a fast, large ESD pulse into a slow, small signal before transmitting the pulse.

The off transistor is often set to a wide transistor width (W width) on the order of several hundreds microns because, unlike other MOS transistors that constitute internal circuits such as a logic circuit, the off transistor needs to let a large amount of electrostatic current that has been drawn in flow through at once.

The off transistor therefore takes up a large area, which poses a problem particularly in a small-sized IC chip by increasing the overall cost of the IC.

A common form of the off transistor is a comb-shaped combination of a plurality of drain regions, source regions, and gate electrodes. However, the structure which is a combination of a plurality of transistors makes it difficult to ensure that all parts of the ESD protection NMOS transistor operate uniformly, which can lead to a concentration of current in, for example, a place at a short distance from the external connection terminal and allows a breakdown without giving the ESD protection NMOS transistor a chance to fully exert its intended ESD protection function.

A remedy for those problems has been proposed in which transistor operation is quickened in accordance with the distance from the external connection terminal by setting the distance between a contact hole and a gate electrode, particularly in a drain region, progressively shorter as the distance from the external connection terminal increases (see JP 07-45829 A, for example).

However, reducing the W width in an attempt to reduce the area that the off transistor takes up renders the off transistor incapable of implementing its protection function satisfactorily. The proposed remedy, in which the transistor operation speed is adjusted locally by adjusting the distance from a contact hole to a gate electrode in a drain region, also has additional problems including a failure to secure a desired contact width due to the reduced drain region width, and a chance that adjusting the distance from the contact hole to the gate electrode alone is not enough to deal with the further increased surge propagation speed which has been brought about in recent years by the development of wiring containing high-melting point metal and the resultant lowering of wiring resistance. Moreover, the proposed remedy does not disclose a measure for preventing the ESD breakdown of an internal circuit element by allowing the off transistor to operate on a voltage lower than that of the internal circuit element and by drawing as large a ratio of ESD pulses as possible into the off transistor while inhibiting the propagation of ESD pulses to the internal circuit element.

SUMMARY OF THE INVENTION

To solve those problems, the present invention provides a semiconductor device structured as follows.

The semiconductor device according to the present invention includes: an NMOS transistor of an internal element which is located in an internal circuit region among other components; an ESD protection NMOS transistor which is provided between the internal circuit region and an external connection terminal in order to protect the NMOS transistor of the internal element and other internal elements against breakdown from ESD; and trench isolation regions, in which one of the trench isolation regions is placed between a substrate potential-fixing P-type diffusion region of the ESD protection NMOS transistor and source and drain regions of the ESD protection NMOS transistor, and has a depth greater than a depth of another of the trench isolation regions that is placed between a substrate potential-fixing P-type diffusion region of the NMOS transistor of the internal element and source and drain regions of the NMOS transistor of the internal element.

With those measures, a hold voltage for keeping the ESD protection NMOS transistor in bipolar operation may be made lower than a hold voltage of the NMOS transistor of the internal element, without increasing the number of process steps and the area taken up by the ESD protection NMOS transistor. A semiconductor device that includes the ESD protection NMOS transistor having a satisfactory ESD protection function is thus provided.

The measures described above may make a hold voltage for keeping the ESD protection NMOS transistor in bipolar operation lower than a hold voltage of the NMOS transistor of the internal element, without increasing the number of process steps and the area taken up by the ESD protection NMOS transistor. As a result, a semiconductor device that includes the ESD protection NMOS transistor having a satisfactory ESD protection function is provided.

BRIEF DESCRIPTION OF THE DRAWING

The accompanying drawing, FIG. 1, is a schematic sectional view illustrating an ESD protection NMOS transistor and an NMOS transistor of an internal element in a semiconductor device according to an embodiment of the present invention.

DETAILED DESCRIPTION OF THE PREFERRED EMBODIMENT

FIG. 1 is a schematic sectional view illustrating an ESD protection NMOS transistor and an NMOS transistor of an internal element in a semiconductor device according to an embodiment of the present invention.

An ESD protection NMOS transistor 601 is described first.

On a P-type silicon substrate 101 that is a first conductivity type semiconductor substrate, a source region 201 and a drain region 202 are formed of a pair of high concentration N-type impurity regions. A first trench isolation region 301 is formed between the ESD protection NMOS transistor 601 and another element in order to insulate and isolate the ESD protection NMOS transistor 601 from another element by shallow trench isolation.

A gate insulating film 401 is formed of a silicon oxide film or the like on a channel region in a part of the P-type silicon substrate 101 that is located between the source region 201 and the drain region 202. A gate electrode 402 is formed of a polysilicon film or the like on the gate insulating film 401. A second trench isolation region 302 is provided between a substrate potential-fixing P-type diffusion region 501 and the source region 201 of the ESD protection NMOS transistor 601. The depth D2 of the second trench isolation region 302 is greater than the depth D1 of the first trench isolation region 301.

Though not illustrated in the drawing, the source region 201 is electrically connected to have the same ground electric potential (Vss) as the gate electrode 402, thereby keeping the ESD protection NMOS transistor 601 in an off state and making the ESD protection NMOS transistor 601 into an "off" transistor. The drain region 202 is connected to an external connection terminal.

The example of FIG. 1 illustrates, for simplification, only an ESD protection NMOS transistor including the source region 201 and the drain region 202 formed of a pair of high concentration N-type impurity regions. However, in practice, an ESD protection NMOS transistor requires a wide transistor width in order to let a large amount of current caused by static electricity flow through, and often takes a form that includes many source regions and drain regions.

An NMOS transistor of an internal element 602 is described next.

On the P-type silicon substrate 101 that is the first conductivity type semiconductor substrate, a source region 201 and a drain region 202 are formed of a pair of high concentration N-type impurity regions. A first trench isolation region 301 is formed between the ESD protection NMOS transistor 601 and another element in order to insulate and isolate the ESD protection NMOS transistor 601 from another element by shallow trench isolation.

A gate insulating film 401 is formed of a silicon oxide film or the like on a part of the P-type silicon substrate 101 that is the internal element and located between the source region 201 and the drain region 202. A gate electrode 402 is formed of a polysilicon film or the like on the gate insulating film 401. A first trench isolation region 301 is provided between a substrate potential-fixing P-type diffusion region 502 and the source region 201 of the NMOS transistor 602 of the internal element. FIG. 1 illustrates only the NMOS transistor 602 as a component of an internal element for simplification. However, in an actual IC, many PMOS transistors and other elements that constitute semiconductor circuits are formed.

A comparison between the ESD protection NMOS transistor 601 and the NMOS transistor 602 of the internal element is given next to describe characteristics of the present invention.

The second trench isolation region 302 is placed between the substrate potential-fixing P-type diffusion region 501 of the ESD protection NMOS transistor 601 and the source region 201 and the drain region 202 of the ESD protection NMOS transistor 601, and has a depth greater than a depth of the first trench isolation region 301 that is placed between the substrate potential-fixing P-type diffusion region 502 of the NMOS transistor 602 of the internal element and source and drain regions of the NMOS transistor 602 of the internal element.

This makes a hold voltage for keeping the ESD protection NMOS transistor 601 in bipolar operation lower than a hold voltage of the NMOS transistor 602 of the internal element, which means that a large amount of current or pulse applied from the outside is let flow into the ESD protection NMOS transistor 601 quickly and preferentially. A semiconductor device that includes the ESD protection NMOS transistor 601 having a satisfactory ESD protection function is thus provided.

The embodiment simplifies the description by describing a case where the ESD protection NMOS transistor 601 and the NMOS transistor 602 of the internal element have a conventional structure. Instead, the ESD protection NMOS transistor 601 and the NMOS transistor 602 of the internal element may have a double diffused drain (DDD) structure or an offset drain structure.

What is claimed is:

1. A semiconductor device, comprising:
   an NMOS transistor in an internal circuit region;
   an ESD protection NMOS transistor provided between the internal circuit region and an external connection terminal in order to protect the NMOS transistor against breakdown from ESD;
   a first trench isolation region placed between a substrate potential-fixing P-type diffusion region of the ESD protection NMOS transistor and source and drain regions of the ESD protection NMOS transistor; and
   a second trench isolation region placed between a substrate potential-fixing P-type diffusion region of the NMOS transistor and source and drain regions of the NMOS transistor, a depth of the first trench region being deeper than that of the second trench isolation region.

2. A semiconductor device according to claim 1, wherein the ESD protection NMOS transistor and the NMOS transistor have a DDD structure.

3. A semiconductor device according to claim 1, wherein the ESD protection NMOS transistor and the NMOS transistor have an offset drain structure.

* * * * *